(12) United States Patent
Lim et al.

(10) Patent No.: US 7,927,497 B2
(45) Date of Patent: Apr. 19, 2011

(54) INTEGRATED THIN-FILM SOLAR CELLS AND METHOD OF MANUFACTURING THEREOF AND PROCESSING METHOD OF TRANSPARENT ELECTRODE FOR INTEGRATED THIN-FILM SOLAR CELLS AND STRUCTURE THEREOF, AND TRANSPARENT SUBSTRATE HAVING PROCESSED TRANSPARENT ELECTRODE

(75) Inventors: Koeng Su Lim, Daejeon (KR); Seong Won Kwon, Daegu (KR); Jeong Hwan Kwak, Seoul (KR); Sang Il Park, Cheongju (KR); Jun-Bo Yoon, Daejeon (KR); Gun-Woo Moon, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 497 days.

(21) Appl. No.: 11/908,826

(22) PCT Filed: Mar. 16, 2006

(86) PCT No.: PCT/KR2006/000973
§ 371 (c)(1),
(2), (4) Date: Sep. 17, 2007

(87) PCT Pub. No.: WO2006/107154
PCT Pub. Date: Oct. 12, 2006

(65) Prior Publication Data
US 2008/0216890 A1    Sep. 11, 2008

(30) Foreign Application Priority Data

Mar. 16, 2005 (KR) .................. 10-2005-0021771
Mar. 16, 2005 (KR) .................. 10-2005-0021895

(51) Int. Cl.
*H01L 31/04* (2006.01)
*H01L 31/18* (2006.01)

(52) U.S. Cl. .................. 216/24; 136/252; 257/E27.125; 257/E31.126; 438/61

(58) Field of Classification Search .................. None
See application file for complete search history.

(56) References Cited

U.S. PATENT DOCUMENTS 3,994,012 A    11/1976   Warner, Jr.
(Continued)

FOREIGN PATENT DOCUMENTS

CN    1498426    5/2004
(Continued)

*Primary Examiner* — Allan Olsen
(74) *Attorney, Agent, or Firm* — The Belles Group, P.C.

(57) ABSTRACT

The present invention relates to integrated thin film solar cells, and more particularly, to integrated thin film solar cells, which minimize the loss of integrated solar cells caused at the time of a manufacturing process and become available at a low cost process, and a method of manufacturing thereof, a processing method of a transparent electrode for integrated thin film solar cells, which widens an effective area and reduces manufacturing costs by minimizing a (insulating) gap between unit cells of the integrated thin film solar cells, and a structure thereof, and a transparent substrate having the transparent electrode. The method of manufacturing integrated thin film solar cells, comprising the steps of: (a) forming a transparent electrode pattern separately over a transparent substrate; (b) forming a solar cell (semiconductor) layer over the substrate of the step (a); (c) forming a first back electrode by obliquely depositing a conductive material over the solar cell (semiconductor) layer; (d) etching the solar cell (semiconductor) layer by using the first back electrode as a mask; and (e) forming a second back electrode so that the transparent electrode and the first back electrode are electrically connected by obliquely depositing a metal over the substrate of the step (d).

20 Claims, 13 Drawing Sheets

U.S. PATENT DOCUMENTS

| | | | | |
|---|---|---|---|---|
| 4,200,472 | A | 4/1980 | Chappell et al. | |
| 4,501,636 | A | 2/1985 | Valley | |
| 4,631,351 | A | 12/1986 | Tawada et al. | |
| 4,740,431 | A * | 4/1988 | Little | 429/9 |
| 4,758,526 | A * | 7/1988 | Thalheimer | 438/80 |
| 6,168,968 | B1 | 1/2001 | Umemoto et al. | |
| 6,172,297 | B1 | 1/2001 | Hezel et al. | |
| 6,207,890 | B1 | 3/2001 | Nakai et al. | |
| 6,299,785 | B1 | 10/2001 | Shimokawa et al. | |
| 6,423,567 | B1 | 7/2002 | Ludemann et al. | |
| 7,019,207 | B2 * | 3/2006 | Harneit et al. | 136/244 |
| 7,355,114 | B2 | 4/2008 | Ojima et al. | |
| 7,615,391 | B2 | 11/2009 | Ojima et al. | |
| 2003/0121542 | A1 * | 7/2003 | Harneit et al. | 136/244 |
| 2004/0035460 | A1 | 2/2004 | Gonsiorawski | |
| 2004/0050816 | A1 | 3/2004 | Asakawa et al. | |
| 2004/0123897 | A1 | 7/2004 | Ojima et al. | |
| 2004/0187916 | A1 | 9/2004 | Hezel | |
| 2007/0131271 | A1 * | 6/2007 | Lim et al. | 136/244 |
| 2007/0131272 | A1 * | 6/2007 | Lim et al. | 136/244 |
| 2008/0216890 | A1 * | 9/2008 | Lim | 136/252 |
| 2010/0012173 | A1 * | 1/2010 | Kwon et al. | 136/252 |
| 2010/0018574 | A1 * | 1/2010 | Kwon et al. | 136/252 |

FOREIGN PATENT DOCUMENTS

| | | |
|---|---|---|
| EP | 1583155 | 10/2005 |
| JP | 07202229 | 8/1995 |
| JP | 08274360 | 10/1996 |
| JP | 11026793 | 1/1999 |
| JP | 11026973 | 1/1999 |
| JP | 11097723 | 4/1999 |
| JP | 11312860 | 11/1999 |
| KR | 1020020005152 | 1/2002 |
| WO | WO02059981 | 8/2002 |
| WO | WO2006107154 | 10/2006 |

* cited by examiner

INTEGRATED THIN-FILM SOLAR CELLS AND METHOD OF MANUFACTURING THEREOF AND PROCESSING METHOD OF TRANSPARENT ELECTRODE FOR INTEGRATED THIN-FILM SOLAR CELLS AND STRUCTURE THEREOF, AND TRANSPARENT SUBSTRATE HAVING PROCESSED TRANSPARENT ELECTRODE

TECHNICAL FIELD

The present invention relates to integrated thin film solar cells, and more particularly, to integrated thin film solar cells, which minimize the loss of the area of the integrated solar cells caused at the time of a manufacturing process and become available at a low cost process, and a method of manufacturing thereof, to a processing method of a transparent electrode for integrated thin film solar cells having a plurality of unit cells insulated at regular gaps and made into a module by electrically serial connection, which minimize a (insulating) gap between the unit cells, and a structure thereof, and a transparent substrate having the transparent electrode.

BACKGROUND ART

Solar cells are semiconductor devices that convert the energy of sunlight directly into electricity. They can be roughly divided into silicon-based solar cells, compound-based solar cells and organic-based solar cells based on the material to be used.

Silicon solar cells are subdivided into single crystalline silicon solar cells, poly-crystalline silicon solar cells, and amorphous silicon solar cells based on the phase of a semiconductor.

Additionally, solar cells are divided into bulk (substrate) solar cells and thin film solar cells based on the thickness of a semiconductor. Thin film solar cells are solar cells having a semiconductor layer thickness of several to several tens of μm.

Among silicon solar cells, single crystalline and polycrystalline solar cells are of a bulk type, and amorphous silicon solar cells are of a thin film type.

Meanwhile, compound solar cells are divided into bulk solar cells comprising GaAs (Gallium Arsenide), InP (indium phosphide), etc. of the III-V group and thin film solar cells comprising CdTe (cadmium telluride) of the II-VI group, CuInSe$_2$ (CIS: copper indium diselenide) of the I-III-VI group, etc. Organic-based solar cells largely comprise organic molecular solar cells and combined organic and inorganic solar cells. Besides, dye-sensitized solar cells are comprised. All of which are of the thin film type.

As stated above, among various types of solar cells, bulk silicon solar cells having a high energy conversion efficiency and a relatively low manufacturing cost have been employed mainly for ground power applications in a wide range of applications.

However, with a rapid increase of the demand for bulk silicon solar cells in recent years, there is a tendency that the costs are increasing due to the shortage of materials. Thereupon, in order to develop techniques for lowering the cost of solar cells for large scale ground power applications and mass-producing them, there is a desperate need for the development of thin film solar cells which can reduce silicon material to 1/100 of the current number.

The large scaling of the thin film solar cells is easier than that of the bulk silicon solar cells. But, as the area of the thin film solar cells are larger, the efficiency of the converting energy is reduced because of the resistance of the transparent electrode.

The solution of the problem is a structure of the intergrated thin film solar cells. In the structure, the loss of the energy generated from the resistance of the transparent electrode is reduced because the transparent electrode is divided into plural strip shape and unit cells formed on the transparent electrode is electrically connected in series. The structure protects the large scaled solar cells from reducing the efficiency of the converting energy. In addition, practical high voltage is generated from one substrate in the structure and process for manufacturing a module is simple.

However, there are other problems in the structure and manufacturing process of intergrated thin film solar cells. Hereafter, the problems will be explained in detail.

FIG. 1 is a view showing a module structure of conventional integrated thin film solar cells. FIG. 2 is an example illustrating a laser patterning process for fabricating a transparent electrode, solar cell (semiconductor) layer and back electrode for the conventional integrated thin film solar cells.

As illustrated in FIG. 1, the conventional integrated thin film solar cells 1 are formed on a glass substrate or a transparent plastic substrate 10 by a plurality of unit cells 20 being electrically connected in series (hereinafter, "transparent substrate").

Therefore, the module of the integrated thin film solar cells comprises a transparent electrode 22 formed in the shape of strips, being segmented (insulated) from each other, on top of the transparent substrate 10, which is an insulating material, a unit solar cell (semiconductor) layer 24 formed in the shape of strips by covering the transparent electrode 22, and a back electrode layer 26 formed in the shape of strips by covering the solar cell layer 24, and is constructed in a structure in which the plurality of unit cells 20 segmented (insulated) are electrically connected with each other in series. And, a back protective layer 30 made of resin is formed in a manner to cover the back electrode for the purpose of preventing and protecting the solar cells from electrical short-circuiting.

In order to manufacture the integrated thin film solar cells 1 of such a structure, a laser patterning method, a chemical vaporization machining (CVM) method, a mechanical scribing method using metallic needles and so on are generally used.

The laser patterning method is a technique of etching the transparent electrode 22, the solar cell (semiconductor) layer 24, the back electrode layer 26, etc. mainly by using a YAG laser beam. A concrete method of use will be described below.

As illustrated in FIG. 1, the transparent electrode 22 formed firstly on the transparent substrate 10 is etched in the atmosphere by using a laser beam, then the solar cell (semiconductor) layer 24 formed secondly is segmented (insulated) in the atmosphere by using a laser beam, and the back electrode layer 26 formed last is etched in the atmosphere by laser patterning, thereby electrically connecting the solar cells in series and forming an integrated solar cell.

Problems of such laser patterning method are to be noted.

First of all, the transparent electrode 22 formed on the entire top surface of the transparent electrode 10 is segmented (insulated) in the shape of strips having a pre-determined width by cutting by the laser patterning method as illustrated in FIG. 1. Then, the cut width is typically from 50 to several hundreds of μm.

The formation process of the solar cell (semiconductor) layer 24 to be formed next to the transparent electrode 22 is mostly performed in vacuum, while the laser patterning for cutting the solar cell (semiconductor) layer 24 is performed in the atmosphere, which disables a continuous process in vacuum, thereby deteriorating the operation efficiency of the manufacturing apparatus. As a result, such a process cannot help but act as a factor of increasing the cost of the solar cells. Further, since the substrate is exposed to the air for etching the solar cell layer 24, there may happen to a problem that the characteristics of the solar cell module are degraded due to adhesion of moisture and contaminants.

In the next step, a back electrode is formed in vacuum typically by a sputtering method, and then laser patterning is performed, thereby manufacturing an integrated solar cell. Such a process also may cause the aforementioned problems in process discontinuity and contamination. And, the cut width (ineffective area) between the solar cells 20, is widened, which is lost through two times of laser patterning for cutting the transparent electrode 22 and the solar cell (semiconductor) layer 24 and one time of laser patterning for cutting the back electrode 26 and connecting the solar cells in series, that is, a total of three times of laser patterning. Thus the effective area loss of the solar cells is increased. Moreover, the laser equipment for patterning is expensive, and a precision position control system is required for patterning at a precise position. Due to this, the manufacturing cost increases.

Meanwhile, the chemical vaporization machining method is a technique that cuts the solar cell (semiconductor) layer at once into a plurality of unit cells having a uniform width by locally generating an atmospheric plasma around line electrodes with a diameter of several tens of µm arranged in a grid pattern adjacent to the top of the substrate by using a gas of $SF_6$/He or the like.

Such a chemical vaporization machining method has characteristics that the process time is short, the selectivity of films is superior, and damage to films is small as compared to the laser patterning method. Further, unlike the laser patterning method, etching is carried out in a vacuum state, thus it is possible to prevent the performance of the solar cells from being deteriorated due to an exposure of the substrate to the atmosphere, which is a problem of the laser patterning method, and reduce the manufacturing cost in comparison with the laser patterning method.

However, since etching has to be carried out at a precise position in conformity with the patterned transparent electrode, a precision position control system capable of precisely controlling a position in a vacuum apparatus is required. This emerges as a very difficult problem when it is intended to manufacture integrated solar cells using a large area substrate. Further, the gap that can be etched is about 200 µm to the smallest, which is greater than a (insulating) gap formed by the laser patterning method, and thus the loss of the effective area of the solar cells is increased.

As another etching method, a mechanical scribing method is comprised. This method enables bulk scribing corresponding to a required number of unit cells by using a plurality of metallic needles, and is higher than the laser patterning method in expandability and compatibility with high speed processing. Further, the apparatus and operation costs are the lowest relative to the above-described two methods.

In case of, for example, CIS solar cells, a CdS/CIS layer relatively softer than molybdenum (Mo) can be easily scribed by a scribing method, so it is widely used for the manufacture of CIS solar cells.

However, the existing mechanical scribing method is also limited to use with a solar cell (semiconductor) layer. Thus, there is a problem that laser patterning equipment and a precision position control apparatus or the like for precise position control are required so as to etch molybdenum (Mo) used as a back electrode and zinc oxide (ZnO) used as a front electrode.

DISCLOSURE OF INVENTION

Technical Problem

The present invention is directed to solve the above-said problems, and has its object to provide integrated thin film solar cells, which widen the effective area of the solar cells by reducing a (insulating) gap between unit devices of integrated thin film solar cells, carry out every process in vacuum after the formation of a transparent electrode, and is made into the integrated thin film solar cells by electrically connecting the unit devices of the solar cells in series.

It is another object of the present invention to provide a method of manufacturing the above-said integrated thin film solar cells, which prevents the performance of a module from degrading and reduces manufacturing costs.

It is still another object of the present invention to provide a method of manufacturing the above-said integrated thin film solar cells, which is small enough in degradation of the performance of a module to be ignored and can obtain a desired high voltage from one module.

It is yet another object of the present invention to provide a processing method of a transparent electrode for integrated thin film solar cells using a printing method, which widens the effective area of the solar cells by reducing a (insulating) gap between unit cells of the integrated thin film solar cells and can reduce manufacturing costs because expensive equipment such as a laser, a precision position control system or the like, is not used, and a structure therefor, and a transparent substrate having the transparent electrode.

Technical Solution

The method of manufacturing integrated thin film solar cells according to the present invention comprises the steps of: (a) forming a transparent electrode pattern separately over a transparent substrate; (b) forming a solar cell (semiconductor) layer over the substrate of the step (a); (c) forming a first back electrode by obliquely depositing a conductive material over the solar cell (semiconductor) layer; (d) etching the solar cell (semiconductor) layer by using the first back electrode as a mask; and (e) forming a second back electrode so that the transparent electrode and the first back electrode are electrically connected by obliquely depositing a conductive material over the substrate of the step (d).

Preferably, the step (a) comprises the steps of: (a-1) forming a transparent electrode layer over the substrate; (a-2) forming a photoresister (PR) or polymer pattern separately over the transparent electrode layer; (a-3) etching the transparent electrode layer by using the photoresister or polymer pattern as a mask; and (a-4) removing the photoresister or polymer pattern.

Preferably, as the transparent electrode layer comprises one or more transparent conductive films selected from zinc oxide (ZnO), tin oxide ($SnO_2$) and indium tin oxide (ITO).

Preferably, in the step (a-3), the transparent electrode layer is formed by an isotropic etching method.

Preferably, in the step (a-3), the transparent electrode layer is formed by mesa etching.

Preferably, in the step (a-3), the transparent electrode layer is formed by an anisotropic etching method.

Preferably, in the step (d), the solar cell (semiconductor) layer is etched in a vertical direction.

Preferably, in the step (d), the solar cell (semiconductor) layer is obliquely etched in an oblique direction.

Preferably, the conductive material deposition in the step (e) is performed by an electron beam or thermal deposition, and at the time of conductive material deposition, unit devices are electrically connected in series.

Preferably, as the solar cells comprise one or more selected from a silicon-based thin film solar cells, compound-based thin film solar cells, organic-based solar cells and dry dye-sensitized solar cells.

Preferably, as the silicon-based thin film solar cells comprise any one selected from amorphous silicon (a-Si:H) single junction solar cell, amorphous silicon (a-Si:H/a-Si:H, a-Si:H/a-Si:H/a-Si:H) multi-junction solar cell, amorphous silicon germanium (a-SiGe:H) single junction solar cell, amorphous silicon/amorphous silicon-germanium (a-Si:H/a-SiGe:H) double junction solar cell, amorphous silicon/amorphous silicon-germanium/amorphous silicon-germanium (a-Si:H/a-SiGe:H/a-SiGe:H) triple junction solar cell, and amorphous silicon/microcrystalline (polycrystalline) silicon double junction solar cell.

Preferably, as the first and second back electrodes comprise one or more selected from silver (Ag), aluminum (Al) and gold (Au).

The integrated thin film solar cells according to the present invention is intergrated by electrically connecting the unit devices in series by the above-said method of manufacturing thin film solar cells.

The processing method of manufacturing a transparent electrode for integrated thin film solar cells, comprising the steps of: (a) forming a transparent electrode layer over a transparent substrate; (b) forming a photoresister (PR) or polymer pattern separately over the transparent electrode layer by printing method; (c) etching the transparent electrode layer by using the photoresister or polymer pattern as a mask; and (d) removing the photoresister or polymer pattern.

Preferably, in the step (a), the transparent electrode layer comprises one or more transparent conductive films selected from zinc oxide (ZnO), tin oxide ($SnO_2$) and indium tin oxide (ITO).

Preferably, in the step (c), the transparent electrode layer is etched in a vertical direction.

Preferably, in the step (c), the transparent electrode layer is mesa-etched.

Preferably, in the step (a-3), the transparent electrode layer is isotropically-etched.

The processing method of manufacturing a transparent electrode for integrated thin film solar cells, comprising the steps of: (a) forming a transparent electrode layer over a transparent substrate; (b) forming a photoresister (PR) pattern over the transparent electrode layer by photolithography; (c) etching the transparent electrode layer by using the photoresister pattern as a mask; and (d) removing the photoresister pattern.

The processing method of manufacturing a transparent electrode for integrated thin film solar cells, comprising the steps of: (a) coating a transparent conductive material in a gel state on plate cylinder by using a sol-gel method; and (b) printing the transparent conductive material over the substrate by inserting a transparent substrate between the plate cylinder and an impression cylinder.

The transparent electrode for integrated thin film solar cells according to the present invention is manufactured by the above-said processing method of a transparent electrode for integrated thin film solar cells.

The transparent substrate according to the present invention is formed in the shape of a plurality of strips by insulating the transparent electrode, manufactured by the above-said processing method of a transparent electrode for integrated thin film solar cells, at fine intervals.

Advantageous Effects

As described above, according to the present invention, a (insulating) gap between unit cells of the integrated thin film solar cells can be reduced by several tens of times or more as compared to existing laser patterning and chemical vaporization machining methods. Thus, the effective area of the solar cells can be maximized, and accordingly the performance of the module of the solar cells can be improved.

Furthermore, no precise position control apparatus is required because self-aligning is possible, and no expensive equipment such as a laser, precision position control system and the like is required as etching is performed by using a printing method at the time of processing a transparent electrode, thus reducing manufacturing costs. Further, since every process after the formation of the transparent electrode is carried out in vacuum, it is possible to prevent the performance of the solar cell module from degrading by an exposure to the atmosphere.

BEST MODE FOR CARRYING OUT THE INVENTION

Figure 1:
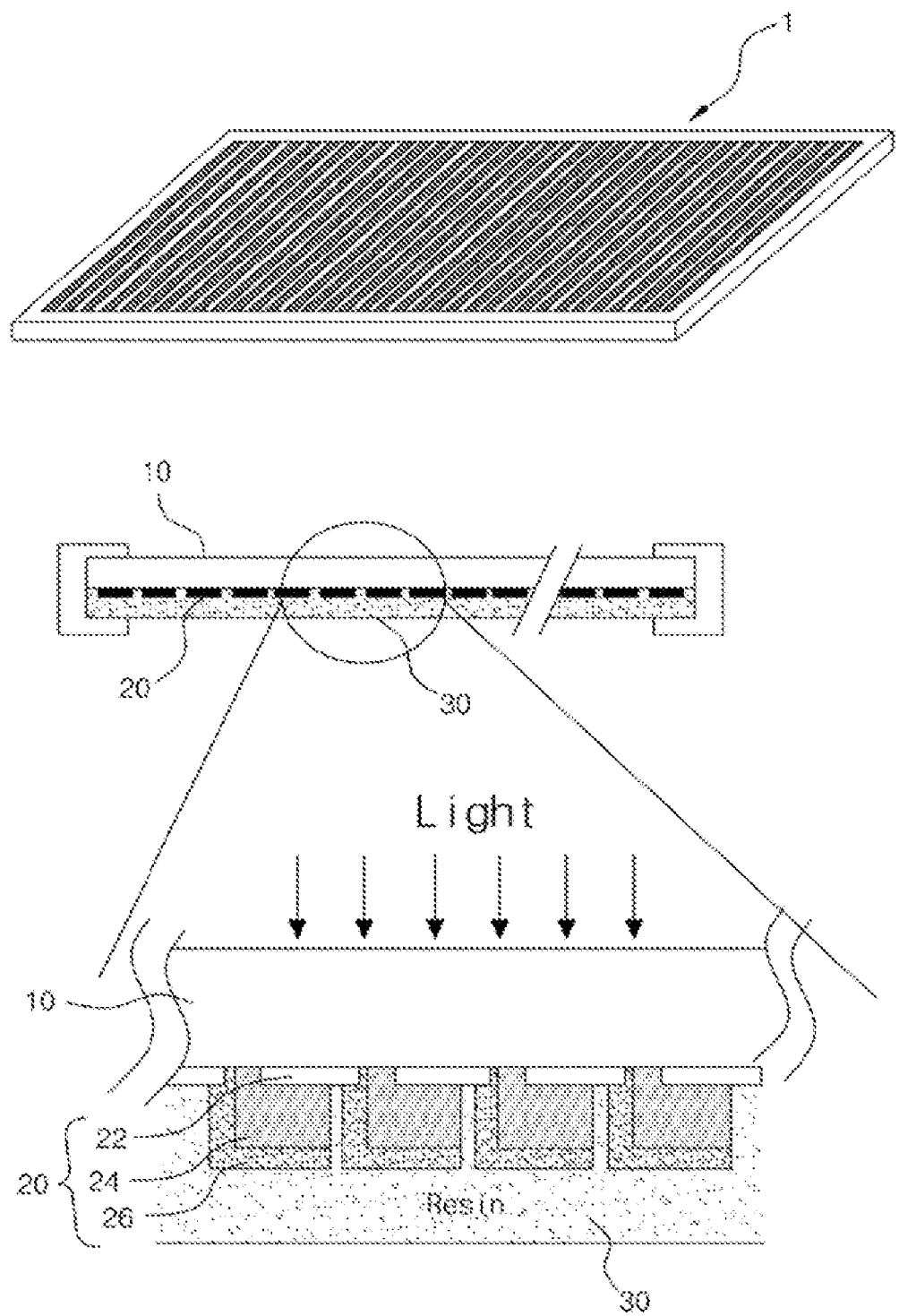
FIG. 1 is a view showing a module structure of conventional integrated thin film solar cells.
Figure 2:
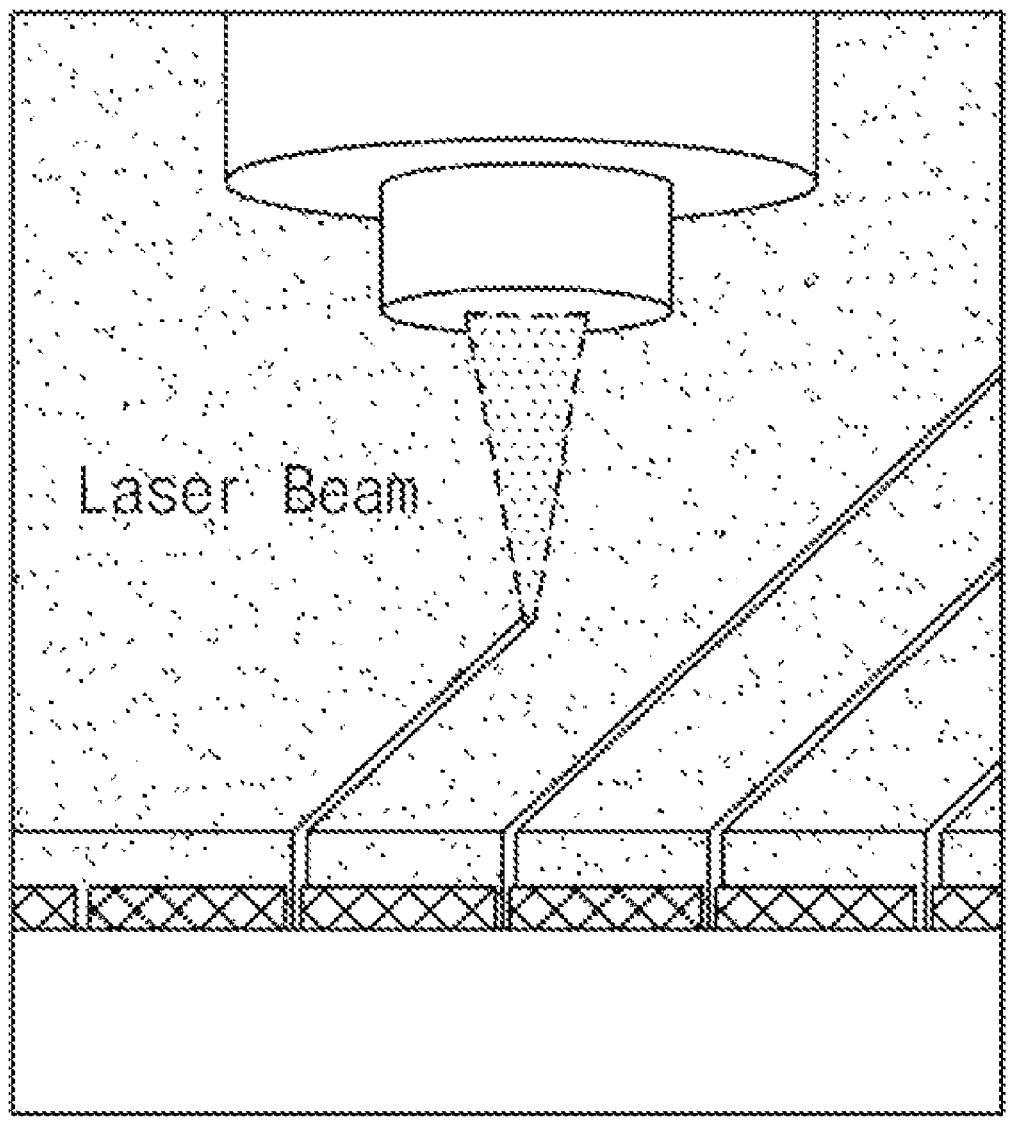
FIG. 2 is an example illustrating a laser patterning process for fabricating a transparent electrode, solar cell layer and back electrode for the conventional integrated thin film solar cells.
Figure 3:
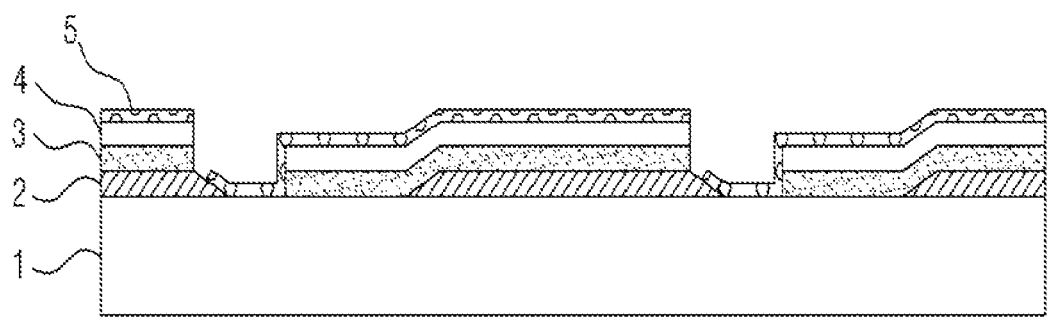
FIG. 3 is a cross sectional view illustrating a structure of integrated thin film solar cells according to the present invention.

FIG. 3 is a cross sectional view illustrating a structure of integrated thin film solar cells according to the present invention. As illustrated therein, the integrated thin film solar cells according to the present invention is constructed of a structure in which a transparent electrode 2 having a sloped section over a predetermined substrate 1, a solar cell (semiconductor) layer 3, a first back electrode 4 and a second back electrode 5 are sequentially stacked.

That is, the transparent electrode 2 is formed with a (insulating) gap, being patterned such that left and right adjacent transparent electrodes 2 can be insulated from each other, the solar cell (semiconductor) layer 3 and the first back electrode 4 are deposited over the patterned transparent electrode 2, the second back electrode 5 positioned over the first back electrode 4 is contacted with the adjacent transparent electrode at one side, thus electrically connecting unit devices in series.

A patterned side portion of the transparent electrode 2 may have an oblique section having a predetermined slope as illustrated in the drawing, but is not limited thereto, and may have a curved oblique section or a section vertical to the substrate 1.

Process steps for manufacturing integrated thin film solar cells according to the present invention will be described in order below.

Figure 15:
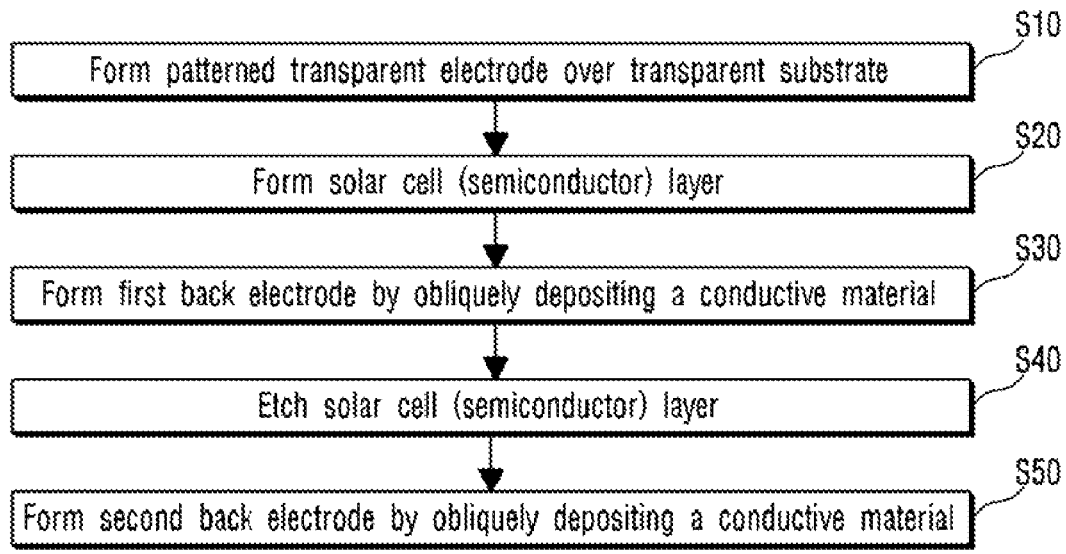
FIG. 15 is a procedure diagram for sequentially explaining process steps as illustrated in FIGS. 4 to 14.
Figure 16:
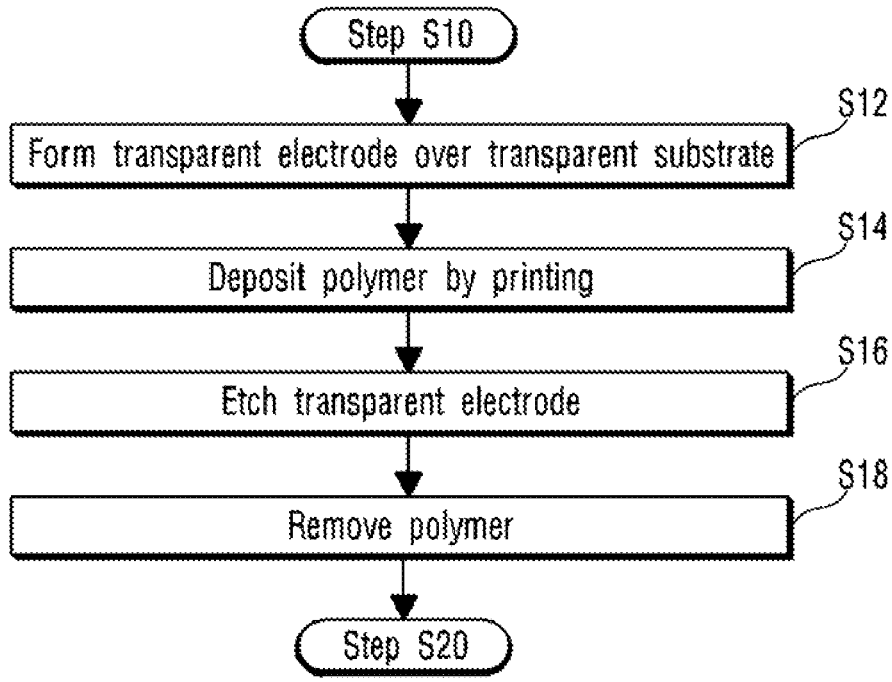
FIG. 16 shows a detailed procedure for the process as illustrated in FIG. 15.

FIGS. 4 to 14 are cross sectional views sequentially illustrating process steps for manufacturing integrated thin film solar cells according to the present invention. FIG. 15 is a procedure diagram for sequentially explaining the process steps as illustrated in FIGS. 4 to 14. FIG. 16 is a detailed procedure diagram for the process as illustrated in FIG. 15.

Referring to FIGS. 4 to 15, FIG. 4 illustrates a cross sectional view of the state in which a transparent electrode having an oblique section is formed over a pre-determined substrate.

As illustrated therein, in the first step of the method of manufacturing integrated thin film solar cells of the present invention, a patterned transparent electrode 2 is formed over a predetermined substrate 1 (S110).

Here, the substrate 1 is a transparent substrate of glass or transparent plastic or the like, and as the transparent electrode 2, one or more transparent conductive films selected from zinc oxide (ZnO), tin oxide ($SnO_2$) and indium tin oxide (ITO) are used.

And, the patterned transparent electrode 2 may either have a textured surface or not.

In the process of patterning the transparent electrode 2, as illustrated in FIGS. 5 to 16, a transparent electrode layer 2 is formed from a thin film over a transparent substrate 1 (S12), and a photoresist (PR) or polymer 20 is coated over the transparent electrode layer 2 by printing so as to be separated at a predetermined distance (S14). After the coating, the transparent electrode 2 is etched by using the photoresist or polymer 20 as a mask, and the photoresist or polymer 20 is removed (S16, S18).

The printing method used at this time includes a screen printing method whose printing apparatus is the simplest and which can easily coat a patterned photoresist or polymer thin film by a low cost process or a gravure press method which enables the formation of the highest precision pattern or the like.

Figure 4:
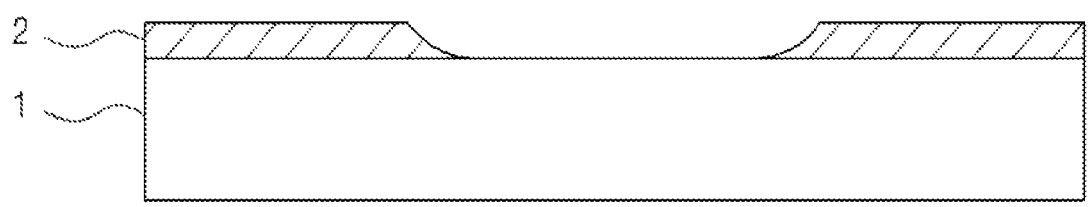
FIG. 4 is a cross sectional view of a substrate having a patterned transparent electrode of the present invention.
Figure 5:
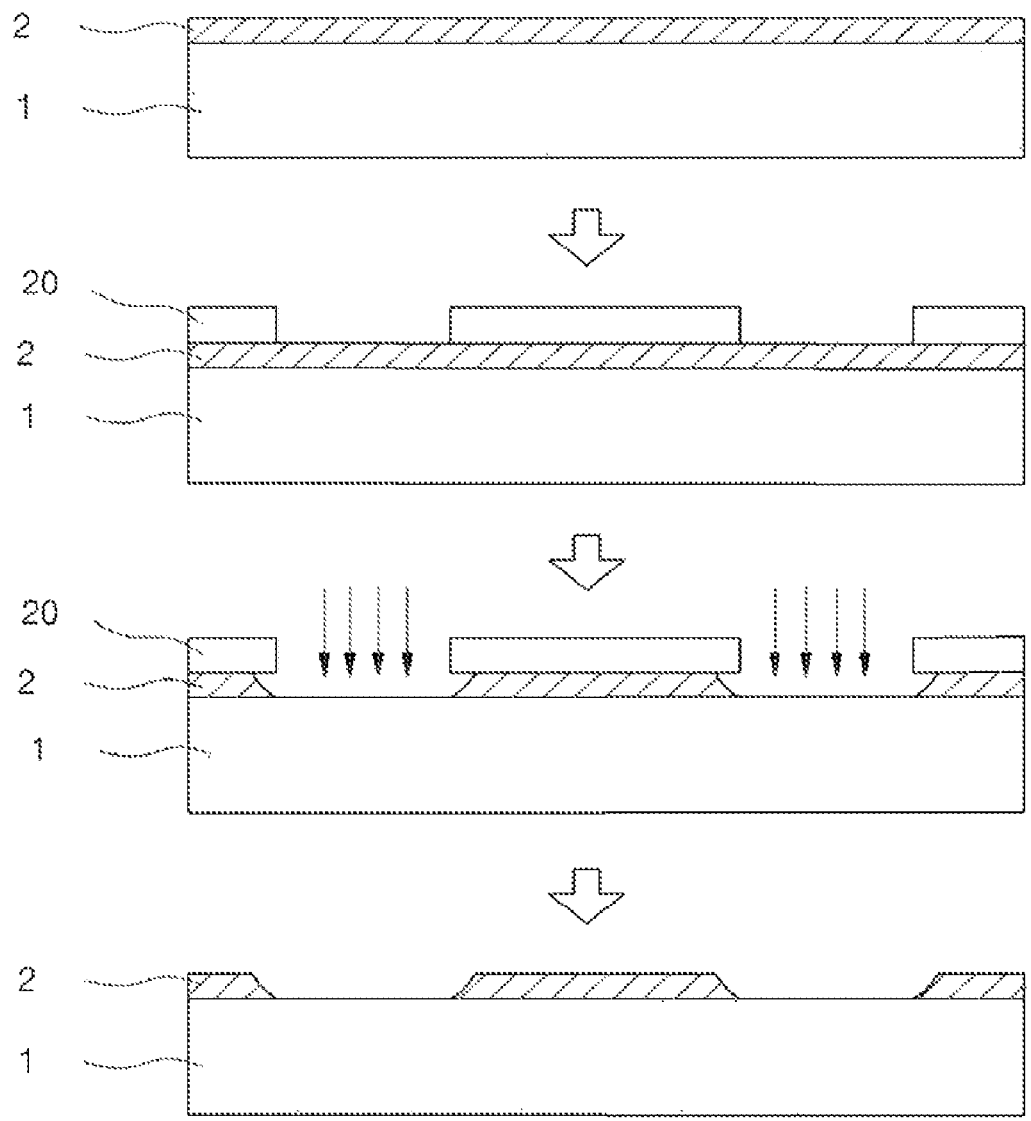
FIG. 5 is a view sequentially illustrating a printing process for patterning the transparent electrode as illustrated in FIG. 4.

In case of etching the transparent electrode 2, an anisotropic or isotropic etching method is used. The transparent electrode 2 etched through the isotropic etching method may be formed in such a pattern that as illustrated in FIG. 4, both side portions have a curved oblique surface and its width becomes larger and larger as it goes downward.

Figure 6:
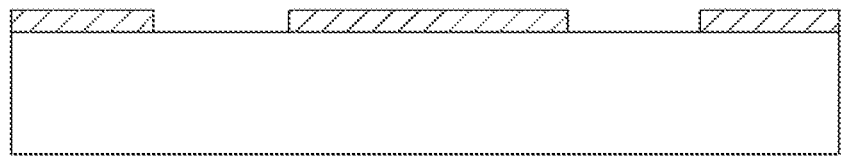
FIGS. 6 and 7 are another embodiment of the patterned transparent electrode according to the present invention.
Figure 7:
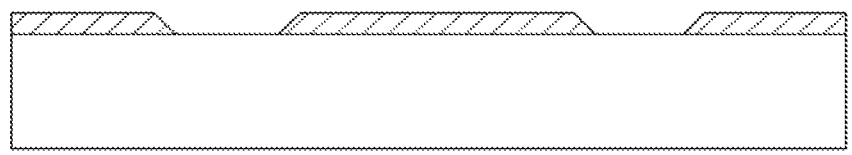

The transparent electrode 2 etched through the anisotropic etching method is formed in such a pattern, as illustrated in FIGS. 6 and 7, to have a section vertical to the substrate or an oblique section having a predetermined slope.

In this way, by utilizing the transparent electrode of the present invention in an etching process by using the principles of each printing method, printing of a high density pattern is enabled, the uniformity of thin films is good, the process is relatively simple, and no expensive equipment for laser patterning is required unlike existing processes, thereby reducing manufacturing costs.

Moreover, in addition to the aforementioned method for patterning a transparent electrode 2, photolithography using the principle that a given photoresist (PR) changes in properties by a chemical reaction occurred upon receiving light can be utilized to form a photoresist in place of polymer coated by printing.

Additionally, by utilizing a printing method using a sol-gel solution containing a material for manufacture of a transparent conductive film, a transparent conductive film can be directly coated over the substrate without the use of a photoresist or polymer pattern using the aforementioned printing method or photolithography. Such methods enable it to directly form a transparent electrode 2 patterned in the shape of strips by a low temperature process without any etching process using masking.

A detailed description of the technique of etching the transparent electrode 2 by patterning will be made later along with the description of FIGS. 17 to 22.

Figure 8:
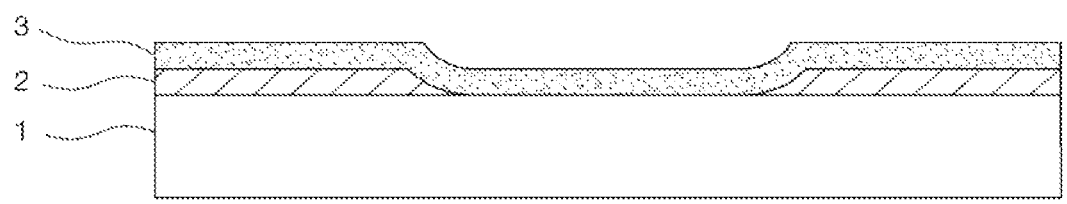
FIG. 8 is a cross sectional view of the state in which a solar cell layer according to the present invention is formed.

Next, referring to FIG. 8, a cross sectional view of the state in which a solar cell layer according to the present invention is formed is illustrated, wherein a solar cell layer 3 is formed over the transparent electrode 2 patterned in the previous step according to the surface shape of the substrate 1 (S20).

Here, as the solar cells, one or more selected from a silicon-based thin film solar cells, compound-based thin film solar cells, organic-based solar cells and dry dye-sensitized solar cells.

As the silicon-based thin film solar cells, used is any one selected from amorphous silicon (a-Si:H) single junction solar cell, amorphous silicon (a-Si:H/a-Si:H, a-Si:H/a-Si:H/a-Si:H) multi-junction solar cell, amorphous silicon germanium (a-SiGe:H) single junction solar cell, amorphous silicon/amorphous silicon-germanium (a-Si:H/a-SiGe:H) double junction solar cell, amorphous silicon/amorphous silicon-germanium/amorphous silicon-germanium (a-Si:H/a-SiGe:H/a-SiGe:H) triple junction solar cell, and amorphous silicon/microcrystalline (polycrystalline) silicon double junction solar cell.

Figure 9:
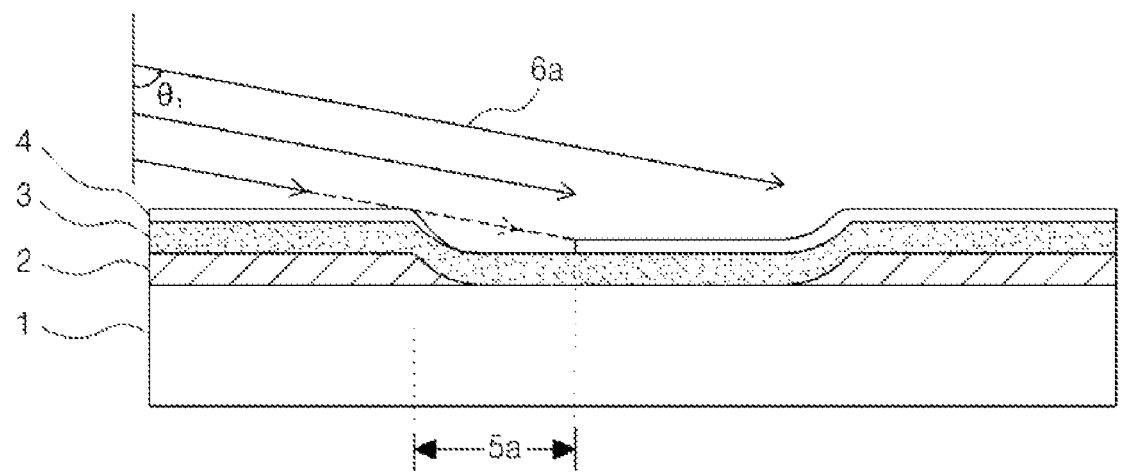
FIG. 9 is a cross sectional view of the state in which a first back electrode according to the present invention is formed.

FIG. 9 is a cross sectional view of the state in which a first back electrode according to the present invention is formed, wherein a first back electrode 4 is formed by obliquely depositing a conductive material, such as metal, over the solar cell layer 3 formed in the previous step by a deposition method, such as an electron beam or thermal deposition (S30).

At this time, the first back electrode 4 is made of a single metal material with a high reflectivity, such as aluminum (Al), silver (Ag), gold (Au), etc., or a multi-metal material of aluminum (Al) and silver (Ag) mixed therein, and an electron beam or thermal deposition apparatus for forming the first back electrode 4 is used.

Therefore, when a conductive material is obliquely deposited at angle 1 ($\theta_1$) through an electron beam or thermal depositor as illustrated in FIG. 9, the conductive material is deposited as a thin film over the solar cell layer 3 by the rectilinear propagation property 6a of deposition to thus form a first back electrode 4, but the first back electrode 4 is not formed at a certain part 5a including an oblique section. This certain parts 5a including an oblique section is a segment etched in the following step.

Figure 10:
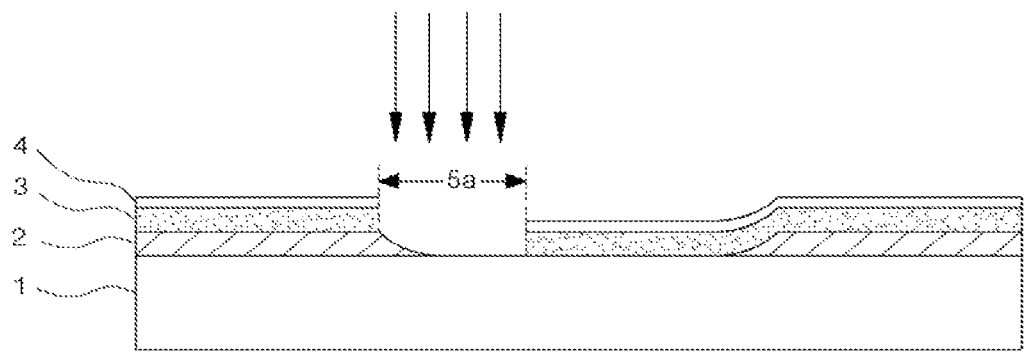
FIGS. 10, 11 and 12 are cross sectional views of the state of vertical or obliquely etching using the first back electrode according to the present invention as a mask.
Figure 11:
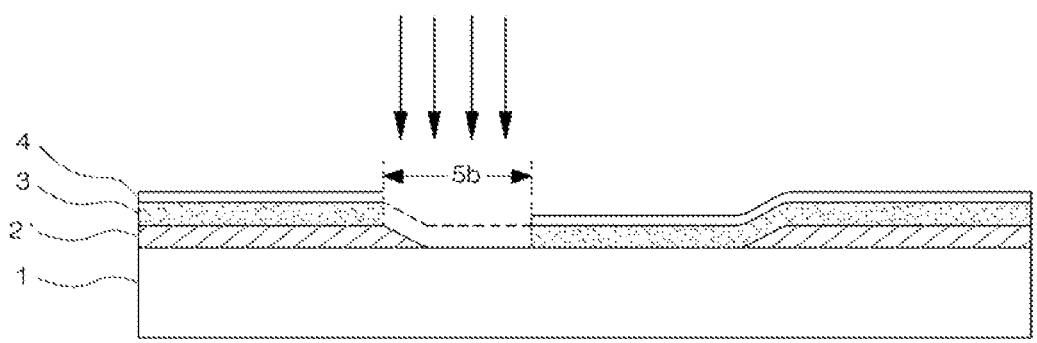

FIGS. 10 and 11 are cross sectional views of the state of vertical etching using the first back electrode according to the present invention as a mask, wherein the etching can be divided into three methods according to the sectional shape of the transparent electrode 2.

That is, as illustrated in FIGS. 10 and 11, in a case where sections of the transparent 2 and 2 are oblique surfaces, the solar cell layer 3 is etched in a vertical direction by using the first back electrode 4 deposited in the process of FIG. 8 as a mask (S40). At the time of etching, it is preferable to use a dry etching process such as reactive ion etching (RIE) or the like.

Figure 12:
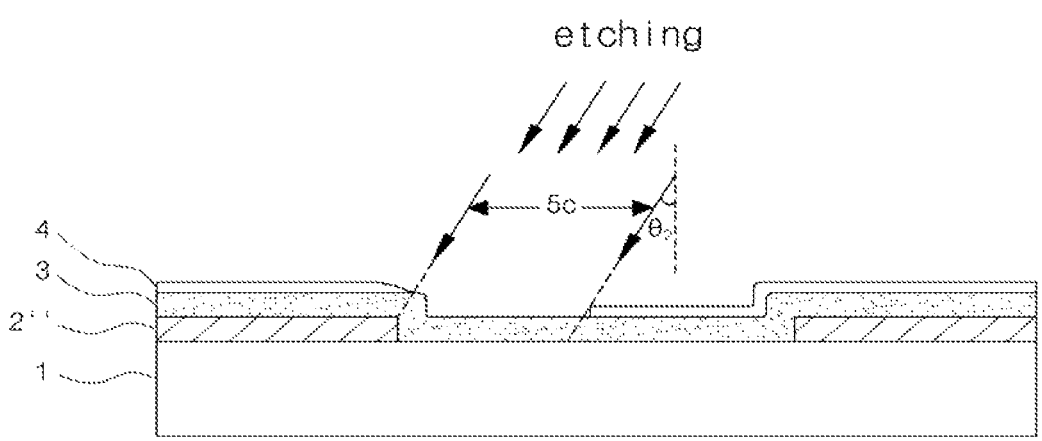

As illustrated in FIG. 12, in a case where the transparent electrode 2 has a vertical section, the solar cell layer 3 is etched in a direction sloped at a predetermined angle ($\theta_2$) with respect to the substrate by using the first back electrode 4 deposited in the process of FIG. 8 as a mask. Unexplained reference numerals 5b and 5c are segments having no first back electrode 4 deposited over the transparent electrode 2 and 2 having an oblique section or vertical section, which are regions to be etched in the following step.

According to the above-described method, a (insulating) gap from several μm to several tens of μm between units devices can be realized since the solar cell layer 3 can be micro-etched without any specific mask. This (insulating) gap can be reduced by several tens to several hundreds of times as compared to the conventional chemical vaporization machining using a plasma and conventional laser patterning using a laser beam. Thus, the effective area of the solar cells can be maximized.

Figure 13:
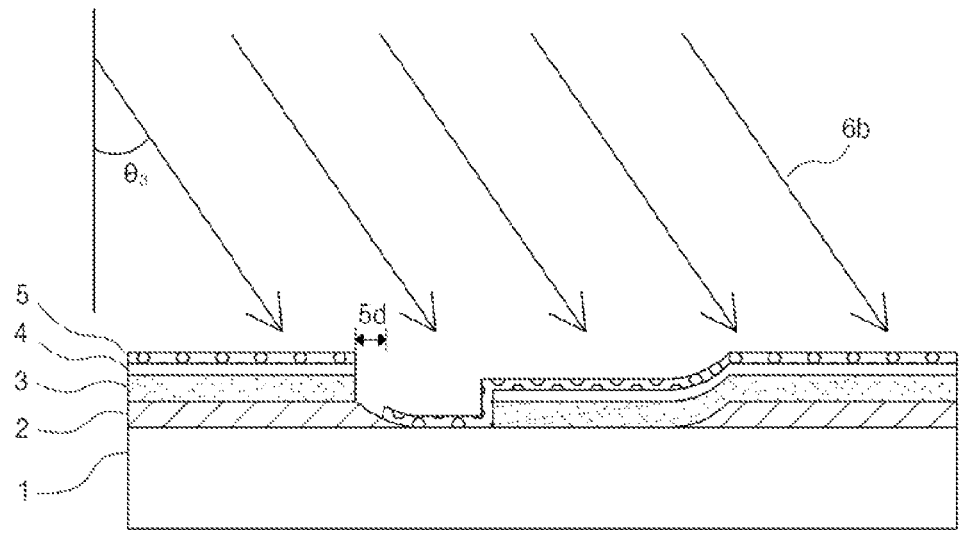
FIGS. 13 and 14 are cross sectional views of the state in which a second back electrode according to the present invention is formed.
Figure 14:
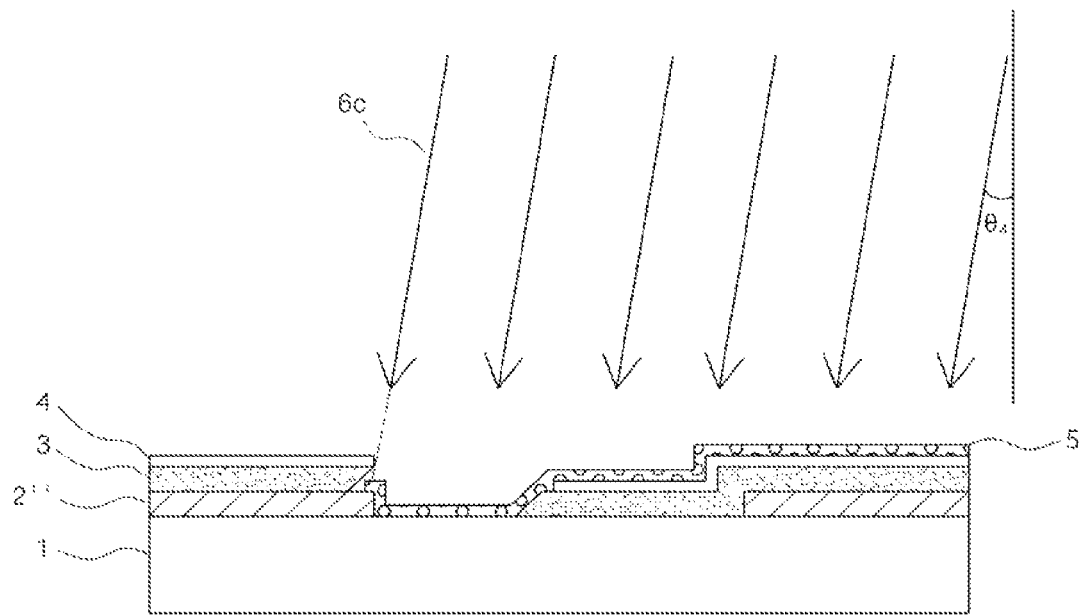

Lastly, referring to FIGS. 13 and 14, FIG. 13 shows a process of forming a second back electrode 5 over the first back electrode 4 etched according to FIG. 10, and FIG. 14 shows a process of forming a second back electrode 5 over the first back electrode 4 etched according to FIG. 12. The process of forming a second back electrode 5 over the first back electrode 4 etched according to FIG. 10 is identical to that of FIG. 13, so it will be omitted.

As illustrated therein, with a predetermined (insulating) gap being formed between unit devices through the etching process of the previous step, a second back electrode 5 is formed by using the same conductive deposition method as the method of depositing the first back electrode 4 (S50).

That is, by obliquely depositing a conductive material at a predetermined angle ($\theta_3$, $\theta_4$) by using an electron beam or thermal deposition apparatus, the conductive material is deposited as a thin film over the first back electrode 4 by the rectilinear propagation property 6b and 6c of deposition to thus form a second back electrode 5, and the second back electrode 5 is not formed at a certain part 5d of an oblique surface by the oblique angle ($\theta_3$).

At this time, the second back electrode 5 may be the same metal as the first back electrode 4 of FIG. 9, or may include a cheap metal, which is different from the first back electrode 4, in order to lower the manufacturing cost of the solar cells.

Subsequently, according to the above-described process, as the transparent electrode 2 of a unit device in the left side and the second back electrode 5 of a unit device in the right side are connected to each other, thereby connecting the unit devices in series.

Since such a procedure is performed by self-alignment without any special position control apparatus, integrated thin film solar cells can be manufactured through a relatively simple process.

Hereinafter, the technique of patterning and etching a transparent over a substrate will be described in detail.

<Method of Forming Transparent Electrode for Integrated Thin Film Solar Cells by Printing>

First of all, techniques of printing to be used in the present invention will be described.

The printing methods to be explained in the present invention are classified into letterpress, intaglio printing or gravure press, offset printing, screen printing, etc. Here, a screen printing method whose printing apparatus is the simplest and which can easily coat a patterned photoresist or polymer thin film by a low cost process or a gravure press method which enables the formation of the highest precision pattern will be described with respect to embodiments applied for implementing the present invention.

The screen printing method is a method that forms a desired pattern by transferring ink onto a working surface by using a squeeze on a given screen. In such screen printing method, the resolution of printing is dependent on the number of meshes of the screen. For instance, if the number of meshes is 254, this means that the number of dots to be printed within the length of 1 inch (25.4 mm) is 100.

By the use of such screen printing method, the distance between one dot and the center of the dot can be reduced up to 100 μm, thus the minimum line width and pitch of about 100 μm can be obtained respectively.

Therefore, by utilizing this principle in the process of etching the transparent electrode of the present invention, a high precision pattern can be printed by adjusting the mesh size. This screen printing method has an advantage that manufacturing costs can be reduced because the uniformity of thin films is good, the process is relatively simple and no expensive equipment for laser patterning is required unlike existing processes. Except, in utilizing this screen printing method to implement the present invention, a photoresist (PR) or polymer, which is turned like ink by being melted by an organic solvent, is used instead of printing ink. At this time, the adjustment of an etching gap is possible if it is accompanied by the viscosity of printing materials and the selection of a proper printing condition (for example, a mesh size).

After coating a photoresist or polymer thin film, it is thermally treated as in a typical aftertreatment of photoresists to thus evaporate the organic solvent and harden the thin film.

The gravure press printing method is one of the intaglio printing methods, for performing printing onto an intaglio plate made by a photographic technique, in which a liquid ink is filled in a depressed portion of the intaglio plate and excessive ink is removed by a doctor blade for printing.

Since a color tone (gray scale) is represented according to the depth of the plate, such gravure printing method has a wide range of applications including various kinds of books or commercial printed matters, art prints, postage stamp prints, printing using substrate materials like cellophane or plastic films having no absorbability or metal foil.

On a gravure printing roll, intaglio halftone dots or ink pockets are formed in order to represent gray scales of an image. Ink of the halftone dots are transferred to thus reproduce the image on a material to be printed.

For example, by using the gravure press printing method that can realize 4500 dpi, the distance between one dot and the center of the dot can be reduced up to 5 to 6 μm, thus the minimum line width and pitch of about 5 to 6 μm can be obtained respectively.

Subsequently, by utilizing the gravure press printing method in the process of etching the transparent electrode of the present invention, a high precision, high density pattern printing is enabled, it is easy to manufacture a thin film having a wide area, and an etching gap can be reduced, thereby minimizing a (insulating) gap between unit cells. Further, like the screen printing method, the process is relatively simple, and unlike the existing processes, expensive equipment for laser patterning is not necessary, thereby reducing manufacturing costs. In this case, it is also preferable to use a photoresist or polymer turned like ink by being melted by an organic solvent in utilizing this method for implementing the present invention.

Besides the above-said printing methods, other printing techniques such as a microcontact printing method or nanoimprinting method can be applied in various ways, and by utilizing these methods for implementing the present invention, a high precision patterned polymer thin film with a larger area can be coated.

Figure 17:
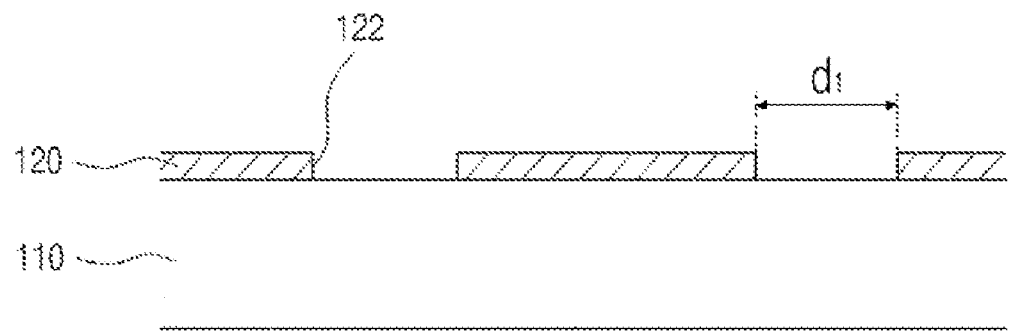
FIGS. 17 to 19 are various embodiments illustrating the transparent electrode for the integrated thin film solar cells according to the present invention.
Figure 18:
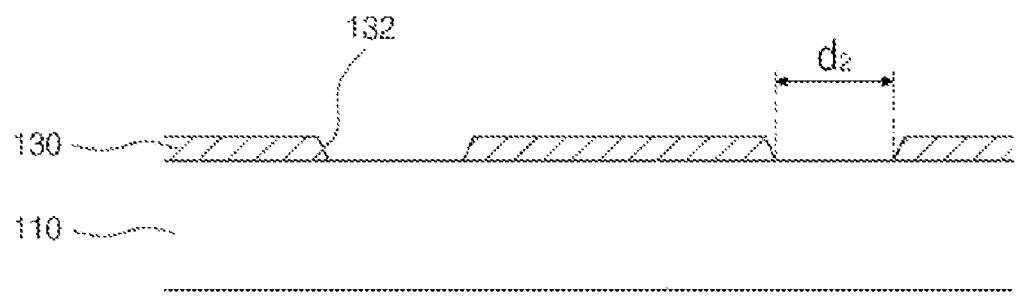
Figure 19:
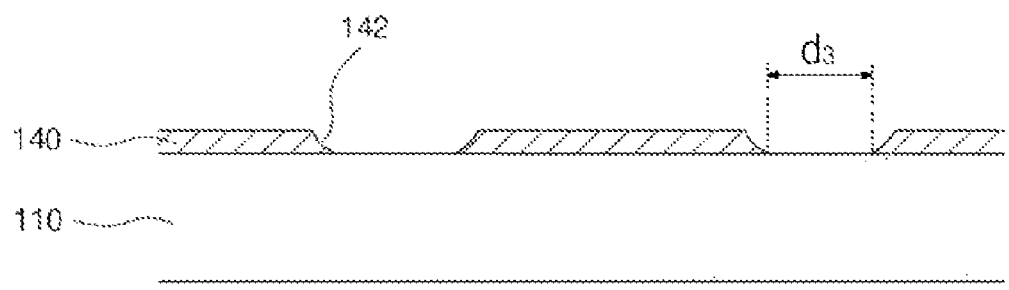
Figure 20:
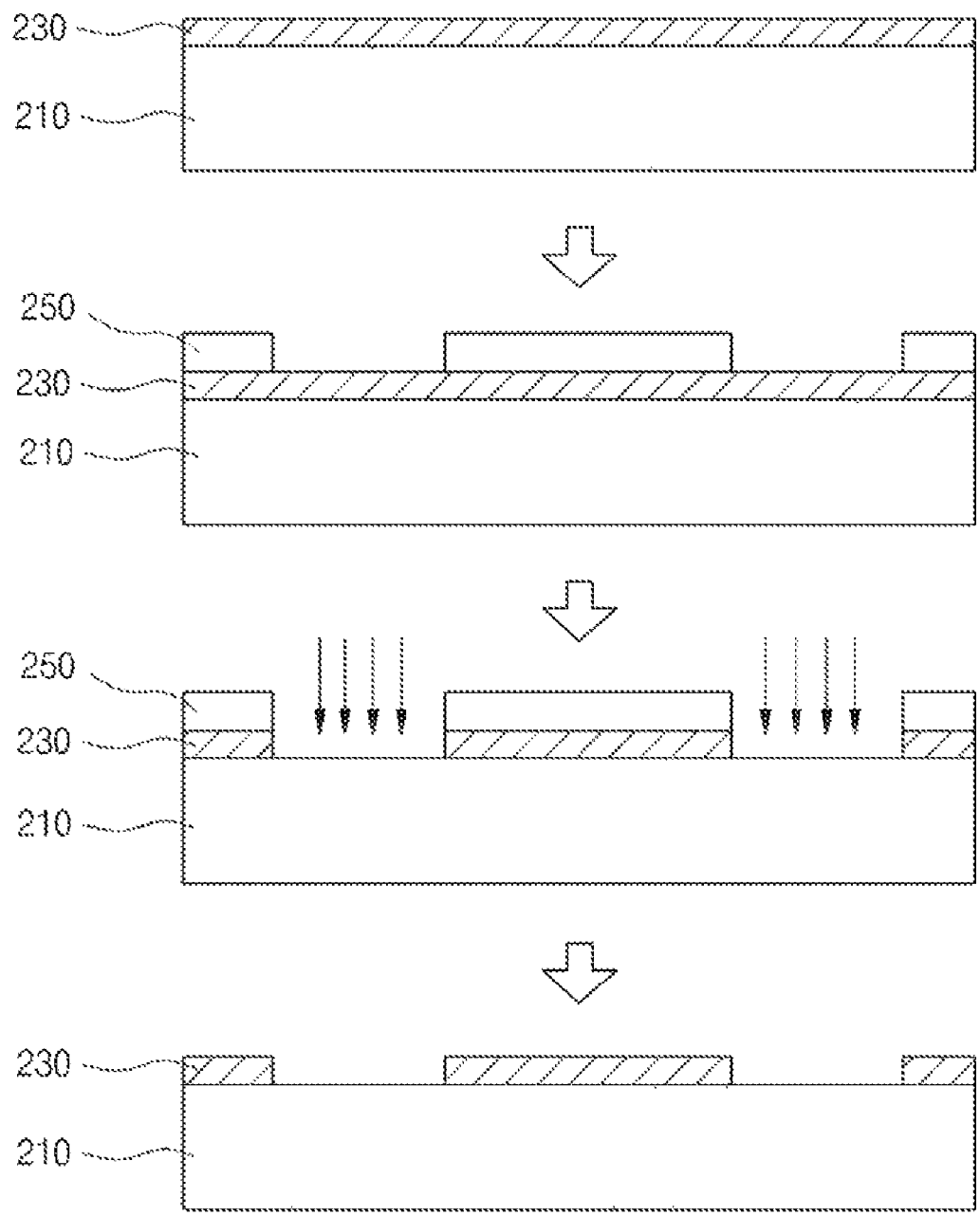
FIG. 20 is an embodiment sequentially illustrating process steps of a printing method for processing the transparent electrode for the integrated thin film solar cells of the present invention as illustrated in FIGS. 17 to 19.

FIGS. 17 to 19 are various embodiments illustrating the transparent electrode for the integrated thin film solar cells according to the present invention. FIG. 20 is an embodiment sequentially illustrating process steps of a printing method for processing the transparent electrode for the integrated thin film solar cells of the present invention as illustrated in FIGS. 17 to 19.

First of all, referring to FIGS. 17 to 19, a transparent electrode 120, 130 and 140 for integrated thin film solar cells according to the present invention is prepared by forming a transparent conductive film patterned in the shape of strips over a pre-determined substrate 110 at equal intervals.

Here, the illustrated substrate 110, which is an insulating material, is a transparent substrate of glass or transparent plastic or the like. As the transparent electrode 120, 130 and 140, a transparent conductive film of zinc oxide (ZnO), tin oxide ($SnO_2$), indium tin oxide (ITO), etc. is used.

Such a transparent electrode 120, 130 and 140 may be formed in such a strip pattern that as illustrated in FIG. 17, side walls have a vertical section 122 and separated and insulated from adjacent transparent electrodes at regular intervals($d_1$), or in such a pattern that as illustrated in FIG. 18, side walls have an oblique surface 132 having a predetermined slope and its width becomes larger and larger as it goes downward. Further, as illustrated in FIG. 19, it may be formed in such a pattern that side walls have a curved oblique surface 142 and its width becomes larger and larger as it goes downward.

The formed transparent electrode 120, 130 and 140 ay either has an indented surface or not.

At this time, as the separation distance $d_1$, $d_2$ and $d_3$ between opposed sidewalls becomes smaller, the effective area of the unit cells of the integrated thin film solar cells becomes wider, thereby achieving a high efficiency.

The process of processing the transparent electrode 120, 130 and 140 of the present invention is as follows.

As illustrated in FIG. 20, firstly, a transparent conductive film serving as a thin film is deposited or coated over a transparent substrate 210, an insulating material, to thus form a transparent 230 layer.

Continuously, a photoresist or polymer 250 is coated over the formed transparent electrode 230 layer by printing after setting a mesh size in advance so that a pre-determined separation distance (d) can be formed between the photoresist or polymer 250. The available separation distance (d) with a high precision ranges from several μm to several tens of μm.

Such photoresist or polymer 250 is for use as a mask for etching the transparent electrode 230 in the etching process of the following step.

According to this process, the photoresist or polymer 250 is formed in the pattern of strips, being separated at a predetermined distance, and at the regions where no pattern is formed, parts of the surface of the transparent electrode 230 are exposed to outside.

Continuously, the exposed surface of the transparent electrode 230 is etched by using the polymer 250 at the top face as a mask, so that a side section of the etched transparent electrode 230 may have a shape of a vertical section, an oblique surface or a curved oblique surface.

At this time, the etching process selectively employs an anisotropic or isotropic etching method according to the etching shape of the transparent electrode 230.

The anisotropic etching method is a technique for performing etching in a vertical direction of the substrate 210 surface or only in a given direction so that an etched section may have a vertical cut section or an oblique cut section. According to this method, as illustrated in FIGS. 17 and 18, a patterned transparent electrode 120, 130 can be formed by etching side walls into a vertical surface or an oblique surface having a predetermined slope.

The isotropic etching method is a technique for performing etching in both vertical and horizontal directions at the same speed so that an etched section may have a slightly curved section after etching, whereby transparent electrodes 130 and 140 etched into a curved oblique surface can be formed as illustrated in FIGS. 18 and 19.

After etching as above, lastly, the photoresist or polymer 250 is removed to thus form a transparent electrode 230 having a pattern of strips over the substrate 210, being insulated at regular intervals.

<Method for Forming Transparent Electrode for Integrated Thin Film Solar Cells by Photolithography>

In addition to the above-described printing methods, an existing photolithography method can be utilized for implementing the present invention.

Figure 21:
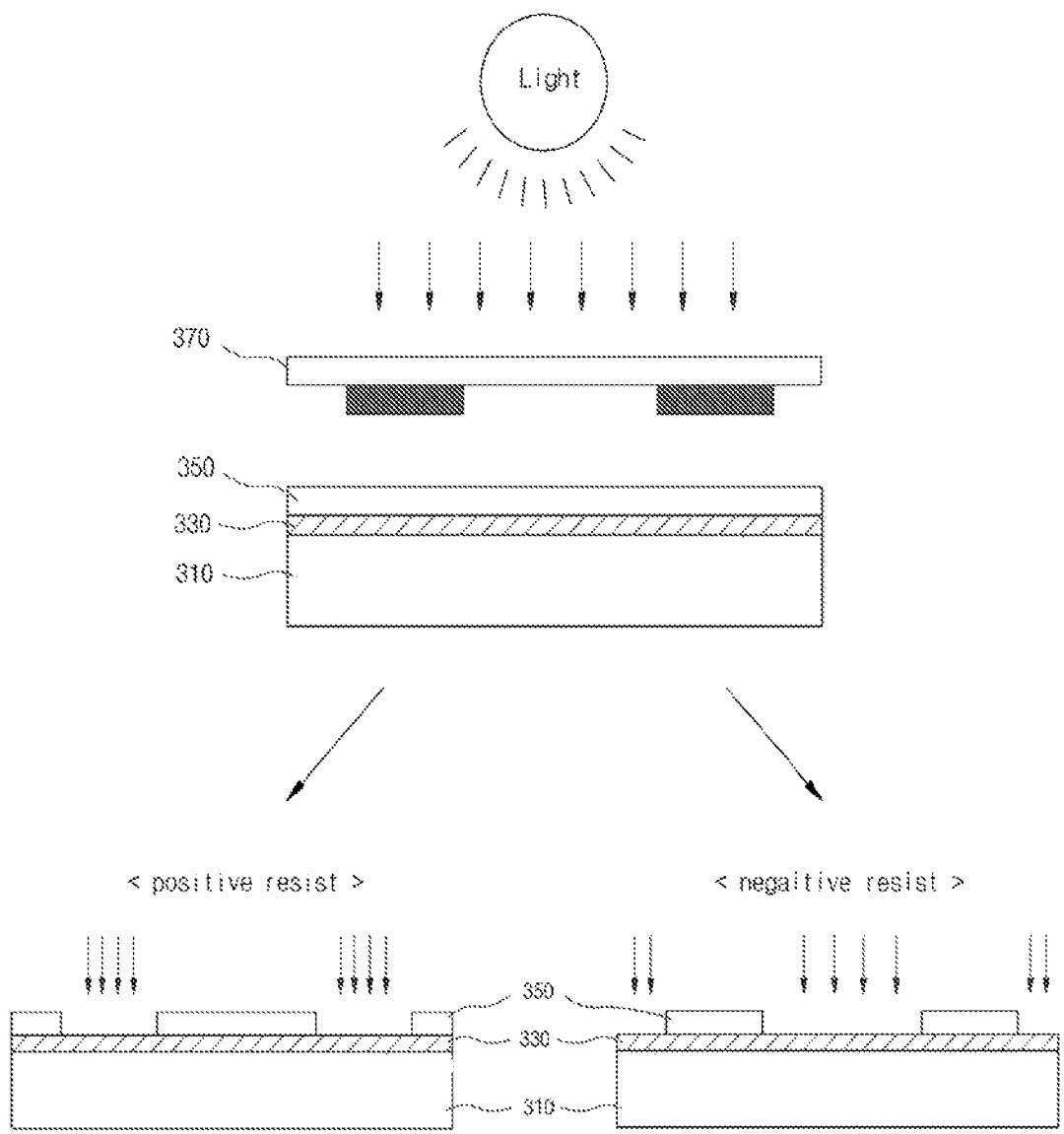
FIG. 21 is another embodiment showing a process using a photolithography method for forming the transparent electrode for the integrated thin film solar cells of the present invention as illustrated in FIGS. 17 to 19.

FIG. 21 is another embodiment showing a process using a photolithography method for forming the transparent electrode for the integrated thin film solar cells of the present invention as illustrated in FIGS. 17 to 19.

The photolithography method to be explained in the present invention is a process that selectively irradiates light onto a photoresist using a mask having a desired pattern to thus form the same pattern as the pattern of the mask by using the principle that a given photoresist (PR) changes in properties by a chemical reaction occurred upon receiving light.

Such a photolithography method includes a photoresist coating process for coating a thin film photoresist, an exposure process for selectively irradiating light using a mask, a development process for forming a pattern by removing the photoresist at light-irradiated parts, and a process for performing etching using the photoresist patterned through the development process as a mask.

That is, as illustrated in FIG. 21, a transparent electrode 330 is deposited as a thin film over a substrate 310, a photoresist (PR) 350 having the same area as the transparent electrode 330 is coated over the deposited transparent electrode 330, and exposure is carried out through a photomask 370 produced in a desired pattern.

Typically, such a photomask 370 forms a desired pattern from metal or emulsion over a glass substrate so that upon exposure, light cannot penetrate the parts where a metal film is formed but light can pass through the parts where no metal film is formed.

Consequently, some parts of the photoresist 350 are exposed, while other parts are not exposed. If the photoresist of the regions exposed to light can be removed by a developing solution, the photoresist is a positive type, while if the photoresist of unexposed regions can be removed by a developing solution; the photoresist is a negative type.

The photoresist 350 formed by this principle is used as a mask for etching the transparent electrode 330 like a polymer pattern formed by printing, and a high precision patterning having a separation distance from several μm to several tens of μm is available. Thus, by utilizing this feature, the present invention can be implemented.

The process for etching the transparent electrode 330 is the same as that explained in the above-said method of forming a transparent electrode by printing.

<Method of Forming Transparent Electrode by Sol-Gel method and Printing Method>

In addition to the above-described method for patterning a transparent electrode, a method of using both a sol-gel method and a printing method is available.

Here, the sol-gel method is one of the methods for forming a functional film such as physical deposition and thermal decomposition. That is, the sol-gel method is a method of producing glass, ceramic, or combined organic and inorganic materials from a liquid (sol) containing an oxide precursor polymer obtained by the hydrolysis of metal organic and inorganic compounds via a gel state.

The sol-gel thin film formation method includes dipping, spin coating, roll coating, spray coating, printing, etc. This sol-gel method is used for applications for manufacture of a thin film including the formation of an antireflective film, an interference filter, a heat wire reflection film, a heat ray reflecting film, a reflecting film and a transparent conductive film.

Figure 22:
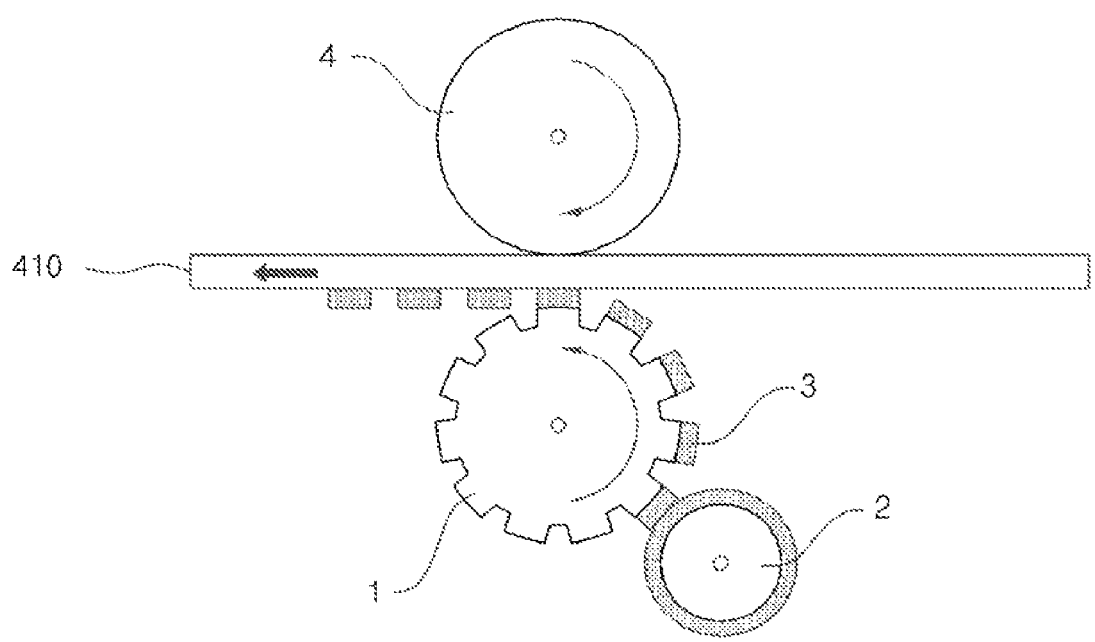
FIG. 22 is another embodiment showing a process using a Sol-Gel method for and a printing method for forming the integrated thin film solar cells of the present invention as illustrated in FIGS. 17 to 19.

FIG. 22 is another embodiment showing a process using a Sol-Gel method for and a printing method for forming the integrated thin film solar cells of the present invention as illustrated in FIGS. 17 to 19, which illustrates an example in which the printing method is utilized by using a sol-gel solution containing a material for the manufacture of a transparent electrode.

That is, as illustrated therein, in order to form a transparent electrode for integrated thin film solar cells according to the present invention, a plate cylinder 1 having a depression formed with a precision is firstly formed, a transparent conductive material 3 manufactured in a gel state using the sol-gel method is coated over the plate cylinder 1 through a transparent conductive material roll 2, and then the transparent conductive material 3 is printed onto a substrate 410 by inserting the substrate 410 between the plate cylinder and an impression cylinder 4.

By adjusting the depression of the plate cylinder 1 with a high precision, the distance between each dot of the transparent conductive material 3 printed onto the substrate 410 and the center of the dot can be reduced up to 5 to 10 μm.

The process of forming a transparent conductive film by the sol-gel method is a well-known art, so a detailed description thereof will be omitted.

That is, by utilizing both of the above-said sol-gel method and printing method, it is possible to directly form a transparent electrode patterned in the shape of strips by a low temperature pressure without any etching process using masking by directly coating a transparent conductive film instead of a photoresist or polymer thin film over a substrate so as to cut the transparent electrode in units of cells as in the printing method implemented in the present invention.

INDUSTRIAL APPLICABILITY

As described above, according to the present invention, a (insulating) gap between unit cells of the integrated thin film solar cells can be reduced by several tens of times or more as compared to existing laser patterning and chemical vaporization machining methods. Thus, the effective area of the solar cells can be maximized, and accordingly the performance of the module of the solar cells can be improved.

Furthermore, no precise position control apparatus is required because self-aligning is possible, and no expensive equipment such as a laser, precision position control system and the like is required as etching is performed by using a printing method at the time of processing a transparent electrode, thus reducing manufacturing costs. Further, since every process after the formation of the transparent electrode is carried out in vacuum, it is possible to prevent the performance of the solar cell module from degrading by an exposure to the atmosphere.

The invention claimed is:

1. A method of manufacturing integrated thin film solar cells, comprising the steps of:
   (a) forming a transparent electrode pattern over a transparent substrate, the;
   (b) forming a solar cell layer over the substrate of the step (a);
   (c) forming a first back electrode by obliquely depositing a first conductive material over the solar cell layer, wherein the oblique deposition of the first conductive material results in one or more portions of the solar cell layer remaining exposed;
   (d) etching the exposed portion of the solar cell layer by using the first back electrode as a mask; and
   (e) forming a second back electrode so that the transparent electrode pattern and the first back electrode are electrically connected by obliquely depositing a second conductive material over the substrate of the step (d).

2. The method as claimed in claim 1, wherein the step (a) comprises the steps of:
   (a-1) forming a transparent electrode layer over the substrate;
   (a-2) forming a photoresister or polymer pattern over the transparent electrode layer;
   (a-3) etching the transparent electrode layer by using the photoresister or polymer pattern as a mask; and
   (a-4) removing the photoresister or polymer pattern.

3. The method as claimed in claim 2, wherein the transparent electrode layer comprises one or more transparent conductive films selected from zinc oxide (ZnO), tin oxide (SnO.sub.2) and indium tin oxide (ITO).

4. The method as claimed in claim 2, wherein in the step (a-3), the transparent electrode pattern is formed by an isotropic etching method.

5. The method as claimed in claim 2, wherein in the step (a-3), the transparent electrode pattern is formed by mesa etching.

6. The method as claimed in claim 2, wherein in the step (a-3), the transparent electrode pattern is formed by an anisotropic etching method.

7. The method as claimed in claim 4 or claim 5, wherein in the step (d), the solar cell layer is etched in a vertical direction.

8. The method as claimed in claim 6, wherein in the step (d), the solar cell layer is obliquely etched in an oblique direction.

9. The method as claimed in claim 1, wherein the second conductive material deposition in the step (e) is performed by an electron beam or thermal deposition, and at the time of the second conductive material deposition, unit devices are electrically connected in series.

10. The method as claimed in claim 1, wherein the solar cell layer of the step (b) comprises one or more silicon-based thin film solar cells, compound-based thin film solar cells, organic-based solar cells and dry dye-sensitized solar cells.

11. The method as claimed in claim 10, wherein the silicon-based thin film solar cells comprise any one selected from amorphous silicon (a-Si:H) single junction solar cell, amorphous silicon (a-Si:H/a-Si:H, a-Si:H/a-Si:H/a-Si:H) multi-junction solar cell, amorphous silicon germanium (a-SiGe:H) single junction solar cell, amorphous silicon/amorphous silicon-germanium (a-Si:H/a-SiGe:H) double junction solar cell, amorphous silicon/amorphous silicon-germanium/amorphous silicon-germanium (a-Si:H/a-SiGe:H/a-SiGe:H) triple junction solar cell, and amorphous silicon/microcrystalline (polycrystalline) silicon double junction solar cell.

12. The method as claimed in claim 1, wherein the first and second back electrodes comprise one or more of silver (Ag), aluminum (Al) and gold (Au).

13. Integrated thin film solar cells, which are integrated by connecting unit devices in series by the method of claim 1.

14. A method of manufacturing integrated thin film solar cells, comprising the steps of:
(a) forming a transparent electrode pattern on a surface of a transparent substrate, the transparent electrode pattern comprising a first gap through which a portion of the surface of the transparent substrate is exposed;
(b) forming a solar cell layer on the substrate resulting from the step a), the solar cell layer having a depression resulting from the solar cell layer filling the first gap;
(c) depositing a first conductive material on the substrate resulting from the step b) at an oblique angle to the surface of the transparent substrate to form a first back electrode comprising a second gap located in the depression through which a portion of the solar cell layer is exposed;
(d) etching the exposed portion of the solar cell layer by using the first back electrode as a mask; and
(e) depositing a second conductive material on the substrate resulting from the step d) at an oblique angle to the surface of the transparent substrate to electrically connect the transparent electrode pattern and the first back electrode.

15. The method of claim 14, wherein the step (a) comprises the steps of:
(a-1) forming a transparent electrode layer over the substrate;
(a-2) forming a photoresister or polymer pattern over the transparent electrode layer;
(a-3) etching the transparent electrode layer by using the photoresister or polymer pattern as a mask; and
(a-4) removing the photoresister or polymer pattern.

16. The method of claim 14, wherein the first conductive material is the same as the second conductive material.

17. The method of claim 14, wherein the second conductive material deposition in the step (e) is performed by an electron beam or thermal deposition, and at the time of the second conductive material deposition, unit devices are electrically connected in series.

18. The method of claim 14, wherein the solar cell layer of the step (b) comprises one or more silicon-based thin film solar cells, compound-based thin film solar cells, organic-based solar cells and dry dye-sensitized solar cells.

19. A method of forming an electrode mask during integrated thin film solar cell manufacturing comprising:
(a) forming a transparent electrode pattern on a surface of a transparent substrate, the transparent electrode pattern comprising a first gap through which a portion of the surface of the transparent substrate is exposed;
(b) forming a solar cell layer on the substrate resulting from the step a), the solar cell layer having a depression resulting from the solar cell layer filling the first gap;
(c) depositing a conductive material on the substrate resulting from the step b) at an oblique angle to the surface of the transparent substrate to form the mask, the mask comprising a second gap located in the depression through which a portion of the solar cell layer is exposed, wherein the mask also serves as a first back electrode.

20. The method of claim 19 wherein the depression comprises a sidewall, and wherein the sidewall prevents the conductive material from being deposited on a portion of the solar cell layer so as to create the second gap.

* * * * *